United States Patent [19]

Iwahashi et al.

[11] Patent Number: 5,283,814
[45] Date of Patent: Feb. 1, 1994

[54] APPARATUS FOR PROCESSING DIGITAL SIGNAL

[75] Inventors: Naoto Iwahashi; Kenzo Akagiri, both of Kanagawa, Japan

[73] Assignee: Sony Corporation, Tokyo, Japan

[21] Appl. No.: 324,048

[22] Filed: Mar. 16, 1989

[30] Foreign Application Priority Data

Mar. 17, 1988 [JP] Japan .................................. 63-65192

[51] Int. Cl.⁵ .......................................... H04B 14/06
[52] U.S. Cl. ........................................ 375/27; 341/76; 348/409
[58] Field of Search ...................... 375/27, 30, 122, 26, 375/33; 358/133, 135, 136, 138, 13; 341/76; 381/29–31, 34, 35

[56] References Cited

U.S. PATENT DOCUMENTS

| | | | |
|---|---|---|---|
| 4,460,923 | 7/1984 | Hirano et al. | 375/27 |
| 4,571,737 | 2/1986 | Nishitani et al. | 375/27 |
| 4,633,325 | 12/1986 | Usubuchi | 358/13 |
| 4,706,260 | 11/1987 | Fedele et al. | 375/27 |
| 4,743,967 | 5/1988 | Takenaka et al. | 375/27 |
| 4,783,792 | 11/1988 | Akagiri et al. | 375/27 |
| 4,797,902 | 1/1989 | Nishiguchi et al. | 375/27 |
| 4,853,780 | 8/1989 | Kojima et al. | 358/136 |

FOREIGN PATENT DOCUMENTS 0186763 9/1986 European Pat. Off. .

Primary Examiner—Stephen Chin
Attorney, Agent, or Firm—Hill, Steadman & Simpson

[57] ABSTRACT

An apparatus for predictive coding processing a digital signal comprises a selective predictive filter, responsive to an input signal for outputting a predictive residual signal, an adaptive predictive filter, responsive to the predictive residual signal, for outputting an optimal predictive residual signal, and a re-quantizing unit means for re-quantizing and outputting the optimal predictive residual signal. The positions of the selective and adaptive predictive filters may be interchanged and the processing apparatus may be either feed forward or feed back type.

5 Claims, 4 Drawing Sheets

APPARATUS FOR PROCESSING DIGITAL SIGNAL

BACKGROUND OF THE INVENTION

The present invention relates to an apparatus for processing a digital signal and more particularly to an apparatus for processing a digital signal employing a method of predictive coding suitable for high quality recording, reproduction, and transmission of such signals as an audio signal.

There has so far been known an apparatus for processing digital signals employing a method of adaptive predictive coding (APC). In a feed-forward predictive coding apparatus, an optimal predictive residual signal, which is a difference between an input signal and an output of an adaptive predictive filter to which the input signal is supplied. On the other hand, in a feedback predictive coding apparatus, while an optimal predictive residual signal being a difference between an input signal and an output of an adaptive predictive filter is obtained, a sum of the optimal predictive residual signal and the output signal of the adaptive predictive filter is supplied to this predictive filter as the input signal thereto.

In either type of these, the adaptive predictive filters are adapted to change their characteristics according to the spectral form of the input signal at a predetermined length of time, and the parameters representative of the filter characteristics are transmitted together with the optimal predictive residual signal or its requantized signal.

There has therefore been a problem that the quantity of the information to be transmitted is increased by the quantity corresponding to the parameters representing the filter characteristics and the efficiency of transmission is lowered accordingly.

To solve this problem, there has been proposed a so-called selective predictive coding apparatus, in which a plurality of predictive filters having predetermined, mutually different, filter characteristics are provided, so that an optimal predictive filter thereof can be selectively used. With this apparatus, a signal for selecting a predictive filter may be transmitted instead of the above described parameters representative of the filter characteristics, and therefore, the efficiency of transmission can be improved accordingly.

However, there has been a problem with the use of the selective predictive filter that the quality of sound of the voice signal obtained by decoding the transmission signal becomes inferior to that obtained with the use of the adaptive predictive filter.

OBJECTS AND SUMMARY OF THE INVENTION

Accordingly, the present invention was directed to the provision of a novel apparatus for processing a digital signal in which the above mentioned problem is solved, and therefore, a major object of the present invention is to propose a digital signal processing apparatus capable of highly efficient transmission with deterioration in quality of sound prevented from occurring.

According to the present invention, a digital signal processing apparatus is comprised of a first predictive filter, responsive to an input signal, for outputting a predictive residual signal, a second predictive filter, responsive to the predictive residual signal, for outputting an optimal predictive residual signal, and a means for outputting the optimal predictive residual signal, in which one of the first and second predictive filters is a selective filter and the other is an adaptive filter.

DETAILED DESCRIPTION OF THE PREFERRED EMBODIMENTS

An embodiment of a digital signal processing apparatus according to the present invention will be described below with reference to the accompanying drawings.

Figure 1:
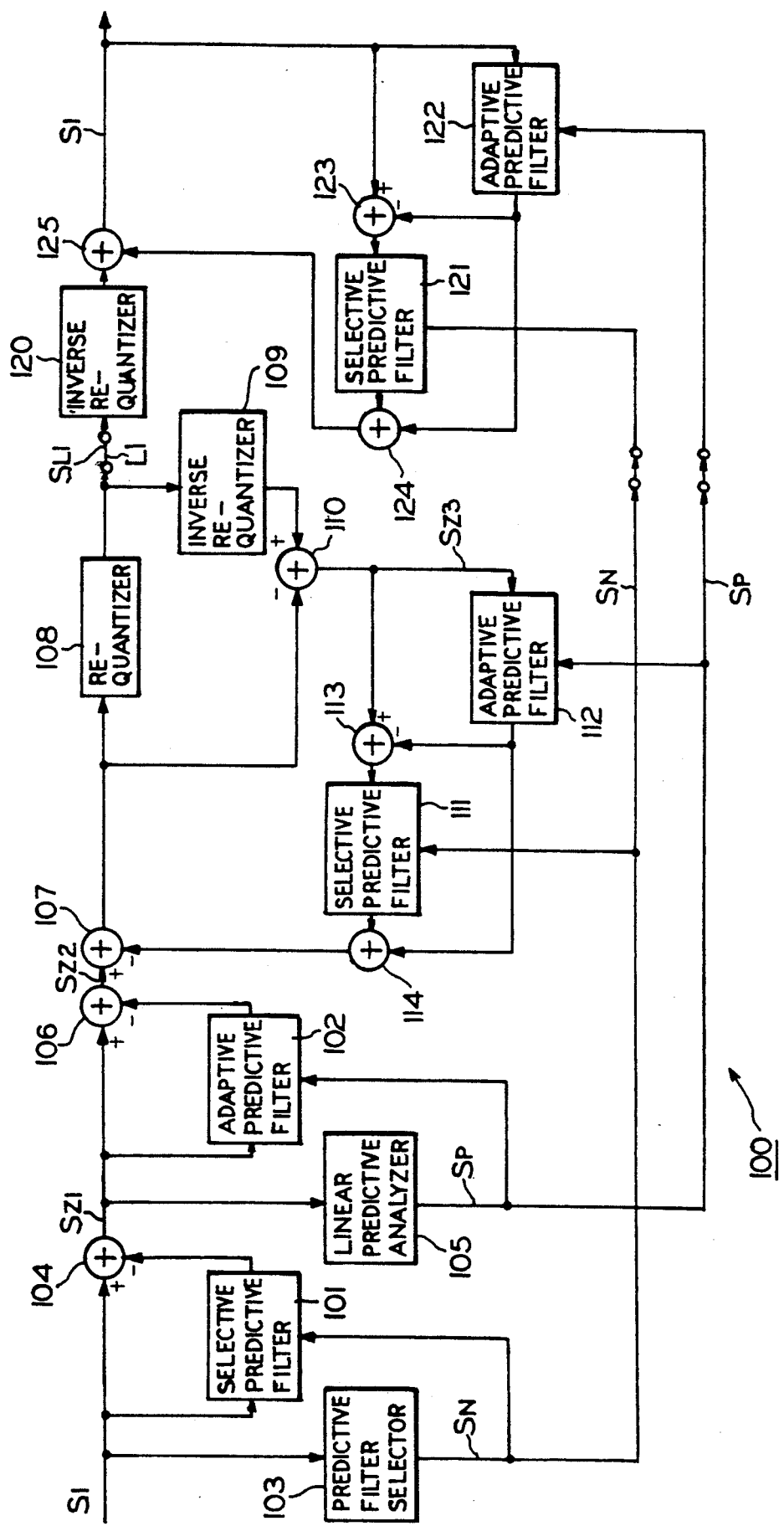
FIG. 1 is a block diagram showing a first embodiment of a digital signal processing apparatus according to the present invention.

First, referring to FIG. 1, a digital signal processing apparatus of a feed-forward type 100 is arranged to use a selective predictive filter 101 and an adaptive predictive filter 102.

More particularly, an input digital signal $S_I$ is supplied to a predictive filter selector 103 and a selection signal $S_N$ for selection among a plurality of predictive filters constituting the selective predictive filter 101 is obtained.

The selective predictive filter 101 is adapted such that a predictive filter among a plurality of predictive filters composing the selective predictive filter 101 is selected in response to the selection signal $S_N$, so that a predictive residual signal $S_{Z1}$ is obtained through a subtractor 104.

A linear predictive analyzer 105, upon receipt of the predictive residual signal $S_{Z1}$, output a parameter signal $S_P$ for changing the filter characteristic of the adaptive predictive filter 102.

The adaptive predictive filter 102, responsive to the parameter signal $S_P$, changes its filter characteristic, and as a result, an optimal predictive residual signal $S_{Z2}$ optimized according to the spectral form of the input digital signal $S_I$ can be obtained through a subtractor 106.

Further, in the digital signal processing apparatus 100, the optimal predictive residual signal $S_{Z2}$ is requantized into a transmission signal $S_{L1}$ of a predetermined bit amount through a subtractor 107 and a re-quantizer 108.

The transmission signal $S_{L1}$ is passed through an inverse re-quantizer 109, having an inverse characteristic to that of the re-quantizer 108, and supplied to a subtractor 110, to which the input signal to the re-quantizer 108 is also supplied.

There are further provided a selective predictive filter 111 of the same characteristic as that of the selective predictive filter 101 and an adaptive predictive filter 112 of the same characteristic as that of the adaptive predictive filter 102, and thereby, a difference signal $S_{Z3}$ obtained from the subtractor 110 is supplied to a subtractor 113 and the adaptive predictive filter 112.

The adaptive predictive filter 112 delivers its output signal through an adder 114 to a subtractor 107 and also delivers its output signal to the subtractor 107 by way of the subtractor 113, to which the difference signal $S_{Z3}$ is also input, and the selective predictive filter 111 and the adder 114.

Thus, the selective predictive filter 111, the adaptive predictive filter 112, the subtractor 113, and the adder 114 together are arranged to constitute a filter having the same characteristic as that of the selective predictive filter 101 and the adaptive predictive filter 102 for extracting the optimal predictive residual signal $S_{Z2}$ from the input digital signal $S_I$.

With the described arrangement, optimization of the optimal predictive residual signal $S_{Z2}$ is attained in a transmission signal $S_{L1}$ obtained through the re-quantizer 108, and thus, compression of the signal can be performed without any deterioration in quality of sound occurring and transmission at high transmission efficiency can be achieved.

On the other hand, the received transmission signal $S_{L1}$ is supplied to an inverse re-quantizer 120, wherein the requantized signal by the re-quantizer 108 is returned to the signal of the original range through the same processing as performed in the inverse re-quantizer 109. The signal is passed through an adder 125, whereby an output signal $S_I$ similar to the signal $S_I$ input to the encoder is obtained, and this signal $S_I$ is supplied to the adder 125 through a selective predictive filter 121, adaptive predictive filter 122, subtractor 123, and an adder 124, of the same configuration as the encoder formed of the selective predictive filter 111, adaptive predictive filter 112, subtractor 113, and the adder 114, and thereby, a decoding process is performed. The switching of the selective predictive filter 121 and adaptive predictive filter 122 is performed in accordance with the received selection signal $S_N$ and parameter signal $S_P$.

Switching of the selective predictive filters 101, 111, 121, adaptive predictive filters 102, 112, 122 and the switching of the range for the re-quantizer 108 and inverse re-quantizers 109, 120 can be performed for each block composed of a predetermined number of samples.

By virtue of the above described arrangement, it has become possible to make the number of filters of the selective predictive filter 101 smaller than before and since, further, the input to the adaptive predictive filter 102 is the residual signal $S_{Z1}$, it has become possible to largely reduce the number of orders of the adaptive predictive filter 102 (the number of taps of delay lines composing the filter). Hence, the quantity of data of the selection signal $S_N$ and parameter signal $S_P$ can be made significantly smaller than the case where the adaptive predictive filter only was used, and if data of the same quantity as before are used, the signal transmission characteristics can be greatly enhanced.

According to experiments using only an adaptive predictive filter of fourth order with parameters for each order transmitted in 16 bits, 8 bits, 8 bits, and 8 bits, it was difficult to completely decode consonants of voice signals.

In contrast, when, in addition to an adaptive predictive filter, a selective predictive filter formed of one predictive filter was employed, and it was thereby adapted such that a residual signal obtained through this selective predictive filter and a residual signal obtained bypassing this selective predictive filter (which in the present case is the input digital signal $S_I$) would be turned into a predictive residual signal $S_{Z1}$, in a selective manner, it was possible to completely decode the voice signal by only transmitting one extra bit for the selection signal $S_N$.

Figure 2:
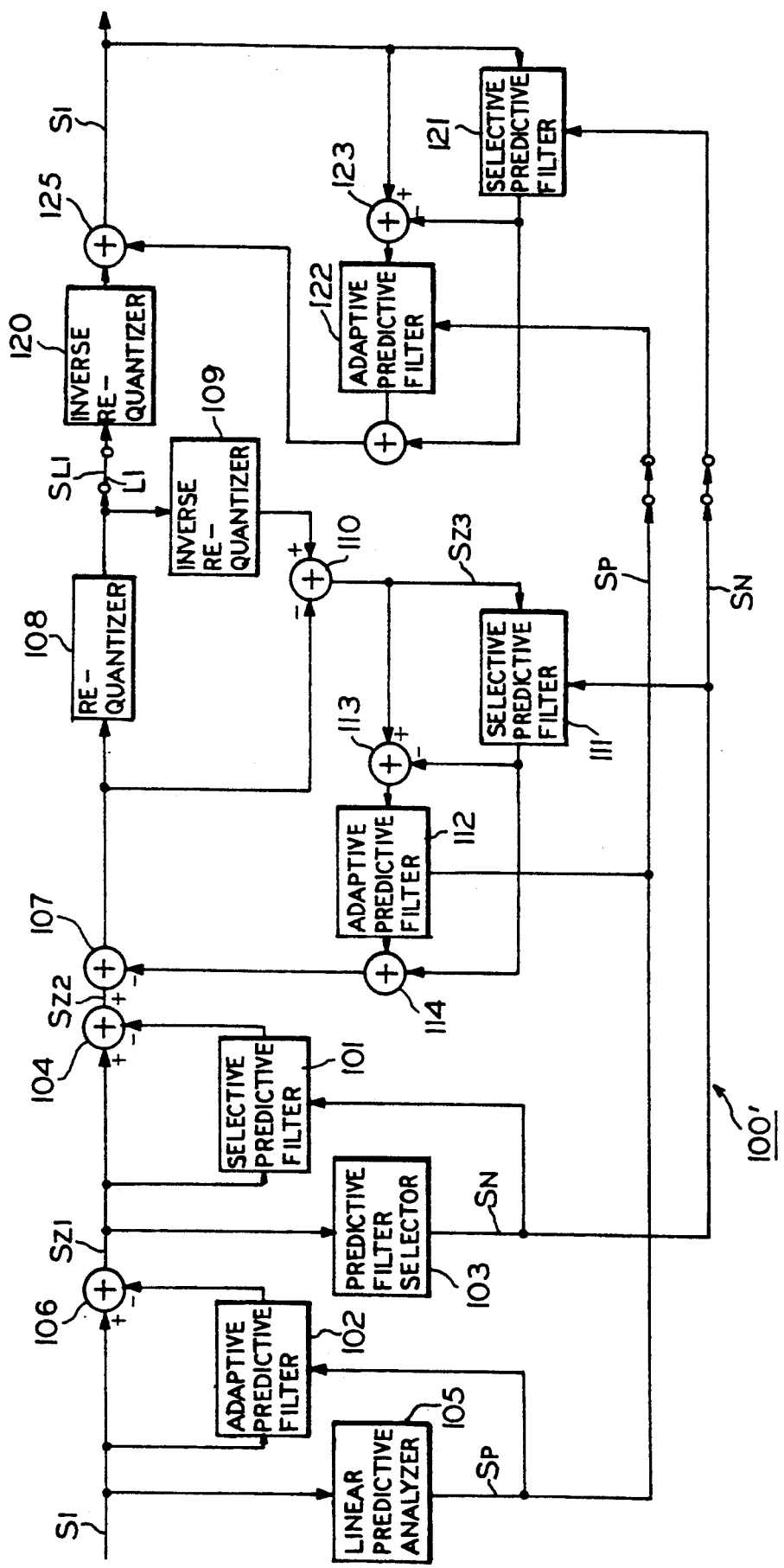
FIG. 2 is a block diagram showing a second embodiment of the same.

A second embodiment will be described with reference to FIG. 2. In the case of this feed-forward digital signal processing circuit 100', the input digital signal $S_I$ is first supplied to an adaptive predictive filter 102 and the predictive residual signal $S'_{Z1}$ obtained as the result is supplied to a selective predictive filter 101 to thereby obtain the optimal predictive residual signal $S'_{Z2}$.

Accordingly, selective predictive filters 101, 111, and 121 and adaptive predictive filters 102, 112, and 122, respectively, are replaced with each other as against the arrangement in the embodiment of FIG. 1.

According to the second embodiment, it is possible to obtain the same results as those obtained in the case of the first embodiment.

In the first and second embodiments, the adaptive predictive filter 112 and the selective predictive filter 111 can be exchanged with each other.

Figure 3:
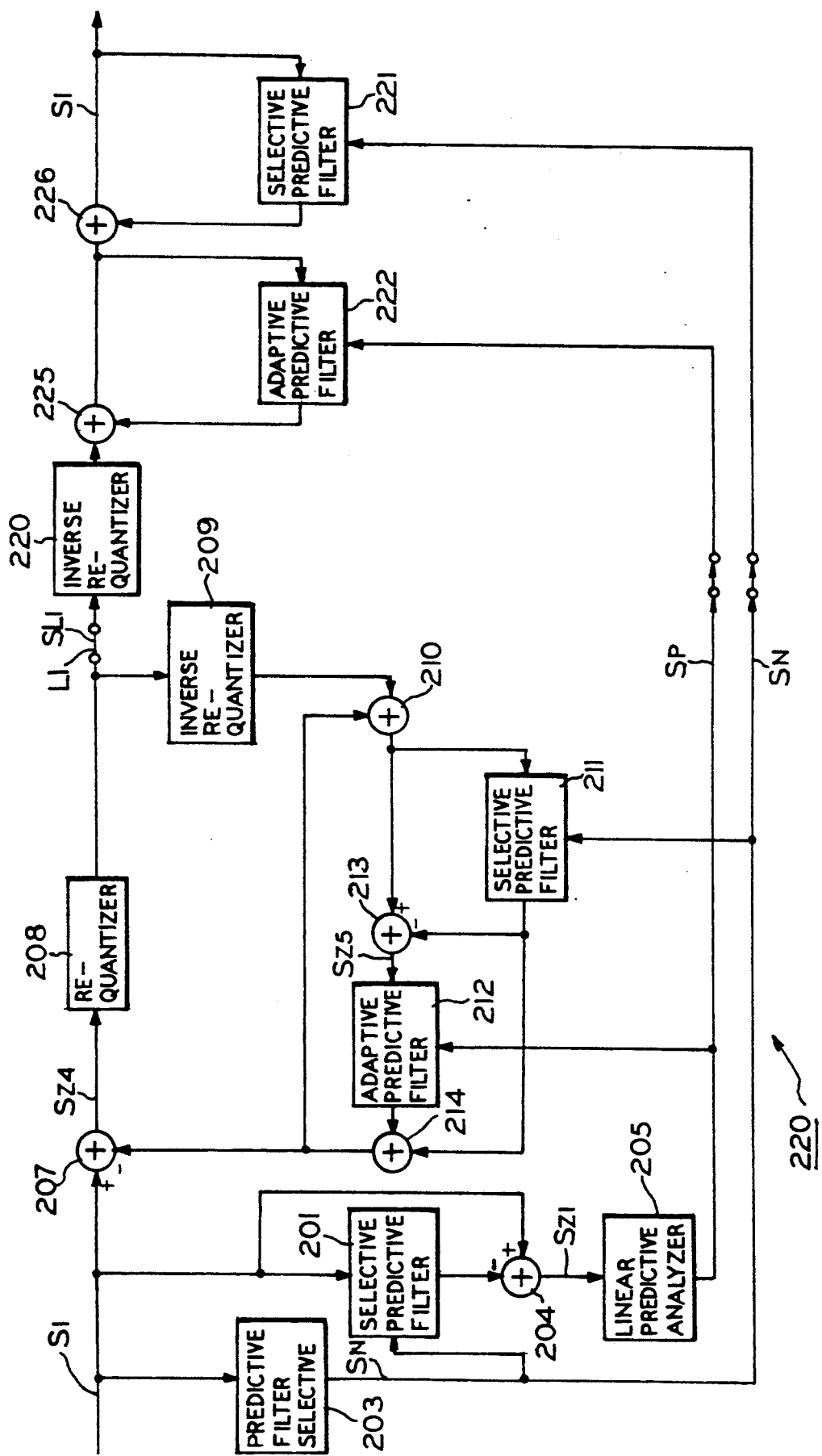
FIG. 3 is a block diagram showing a third embodiment of the same.

A third embodiment will be described with reference to FIG. 3. In a digital signal processing apparatus 200 of a feedback type, an input digital signal $S_I$ is supplied to a predictive filter selector 203, whereby a selection signal $S_N$ for selecting among a plurality of predictive filters forming selective predictive filters 201 and 211 is obtained.

In the selective predictive filter 201, switching of a plurality of predictive filters forming the same is performed according to the selection signal $S_N$, and thereby, a predictive residual signal $S_{Z1}$ is obtained through a subtractor 204.

A linear predictive analyzer 205, upon receipt of the predictive residual signal $S_{Z1}$, outputs a parameter signal $S_P$ for switching the filter characteristics of an adaptive predictive filter 212.

On the other hand, the input digital signal $S_I$ is passed through a subtractor 207, wherein an output of a later described feedback predictive filter is deducted therefrom so that an optimal predictive residual signal $S_{Z4}$ is obtained.

This optimal predictive residual signal $S_{Z4}$ is passed through a re-quantizer 208 and thereby requantized into a transmission signal $S_{L1}$ of a predetermined bit amount.

This transmission signal $S_{L1}$ is supplied to the selective predictive filter 211 through an inverse re-quantizer 209 and adder 210. In the selective predictive filter 211, switching of a plurality of predictive filters forming the same is performed according to the selection signal $S_N$, whereby a predictive residual signal $S_{Z5}$ is obtained through a subtractor 213 to which the output of the adder 210 is supplied.

The residual signal $S_{Z5}$ is supplied to the adaptive predictive filter 212. The adaptive predictive filter 212, responsive to the parameter signal $S_P$, changes its filter characteristics. The output of this filter is added up with the output of the selective predictive filter 211 in an adder 214 and the sum is supplied to the subtractor 207, whereby the optimal predictive residual signal $S_{Z4}$ optimized according to the spectral form of the input digital signal $S_I$ is obtained. Meanwhile, the output of the adder 214 is fed back to the adder 210.

On the other hand, the received transmission signal $S_{L1}$ is supplied to an inverse re-quantizer 220, wherein the requantized signal by the re-quantizer 208 is returned to the signal of the original range through the same processing as performed in the inverse requantizer 209. The signal is passed through an adder 225, wherein the output of an adaptive predictive filter 222 is added thereto, and the sum is further passed through an adder 226, wherein the output of a selective predictive filter 221 is added thereto, and thereby, an output signal $S_I$ similar to the input digital signal $S_I$ input to the encoder is obtained.

The adaptive predictive filter 222 and selective predictive filter 221 are respectively switched in accordance with the received parameter signal $S_P$ and selection signal $S_N$.

Also in this embodiment, similar effects as obtained in the first and second embodiments can be obtained.

Figure 4:
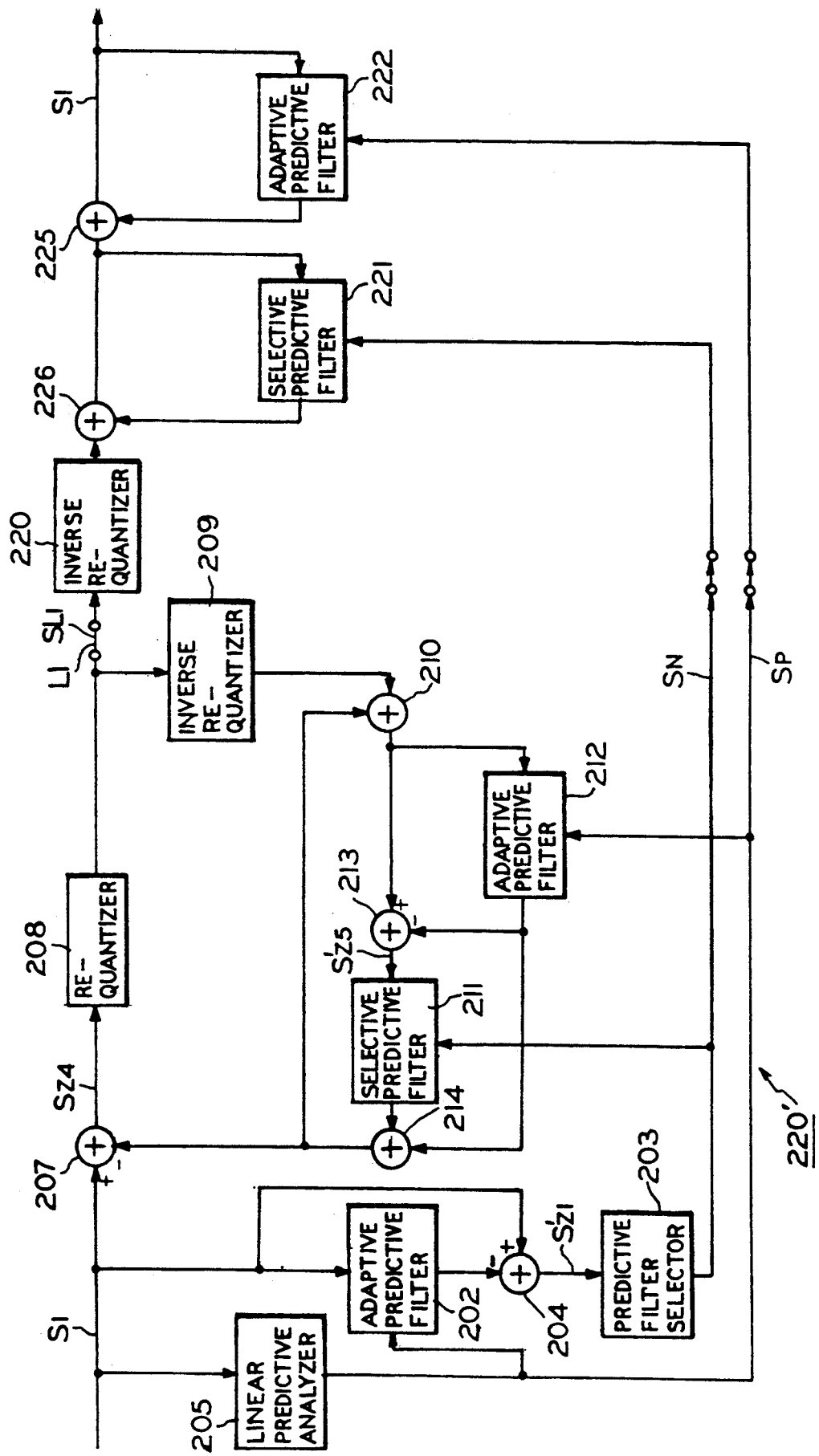
FIG. 4 is a block diagram showing a fourth embodiment of the same.

A fourth embodiment will be described with reference to FIG. 4. In a digital signal processing apparatus 200' of a feedback type, an input digital signal $S_I$ is passed through a linear predictive analyzer 205, whereby a parameter signal $S_P$ for switching filter characteristics of the adaptive predictive filters 202, 212 is provided.

The adaptive predictive filter 202, responsive to the parameter signal $S_P$, changes its filter characteristics and provides a predictive residual signal $S'_{Z1}$ through a subtractor 204.

The predictive filter selector 203, upon receipt of the predictive residual signal $S'_{Z1}$, provides a selection signal $S_N$ for selecting among a plurality of predictive filters composing the selective predictive filter 211.

In the present embodiment, the selective predictive filter 211 and the adaptive predictive filter 212 are changed with each other as compared with the third embodiment.

Also in this embodiment, the same effects as obtained in the first, second, and third embodiments can be obtained.

Further, in each of the third and fourth embodiments, the adaptive predictive filter 212 and the selective predictive filter 211 may be replaced with each other.

The characteristics of the selective predictive filter 111 and adaptive predictive filter 112, and the characteristics of the selective predictive filter 101 and adaptive predictive filter 102, in each combination, can be arranged to be different with each other.

In the feed-forward type, the selective predictive filter 111 and adaptive predictive filter 112 need not be provided, in which case the inverse re-quantizer 109, substractors 110, 113, and the adders 107, 114 become unnecessary.

Further, in the above embodiments, the selective predictive filter 221 and adaptive predictive filter 222 on the reception side can be exchanged with each other.

Although, in the above embodiment, the case where the input digital signal was transmitted after being re-quantized was described, the present invention is not limited to it but can be widely applied to such cases as the input digital signal is recorded and reproduced after being compressed for its information.

According to the present invention as described above, by applying predictive coding to the input signal with the use of the selective predictive filter and the adaptive predictive filter, the input digital signal can be transmitted at high transmission efficiency with deterioration in quality of sound prevented from occurring.

What is claimed is:

1. An apparatus for processing a digital signal comprising:
   a first selective predictive filter responsive to an input signal for outputting a predictive residual signal;
   a first adaptive predictive filter responsive to said predictive residual signal for producing an optimal predictive residual signal;
   a feedback filter connected to receive said optimal signal, said feedback filter being composed of a second selective predictive filter having the same characteristic as that of said first selective predictive filter and a second adaptive predictive filter having the same characteristic as that of said adaptive predictive filter and forming a feedback loop;
   re-quantizing means connected to receive an output signal from said feedback filter and connected to receive said input signal for re-quantizing and outputting the difference between said input signal and the output signal of said feedback filter; and
   inverse re-quantizing means connected to said re-quantizing means and having an inverse characteristic to that of said re-quantizing means for re-quantizing the output signal of said re-quantizing means outputting a re-quantized signal to said feedback filter.

2. An apparatus for processing a digital signal comprising:
   a first adaptive predictive filter responsive to an input signal for outputting a predictive residual signal;
   a first selective predictive filter responsive to said predictive residual signal for producing an optimal predictive residual signal;
   a feedback filter connected to receive said optimal signal, said feedback filter being composed of a second selective predictive filter having the same characteristic as that of said first selective predictive filter and a second adaptive predictive filter having the same characteristic as that of said first adaptive predictive filter and forming a feedback loop;
   re-quantizing means connected to receive an output signal from said feedback filter and connected to receive said input signal for re-quantizing and outputting the difference between said input signal and the output signal of said feedback filter; and
   inverse re-quantizing means connected to said re-quantizing means and having an inverse characteristic to that of said re-quantizing means for re-quantizing the output signal of said re-quantizing means and outputting a re-quantized signal to said feedback filter.

3. An apparatus for processing a digital signal comprising:
   a first predictive filter responsive to an input signal for outputting a predictive residual signal;
   a second predictive filter responsive to said predictive residual signal for outputting an optimal predictive residual signal;
   means responsive to said optimal predictive residual signal for manifesting a transmission output signal, wherein one of the first and second predictive filters is a selective filter and the other is an adaptive filter; and
   including a linear predictive analyzer for generating a control signal connected to said adaptive filter for changing the filter characteristics of said adaptive filter.

4. An apparatus for processing a digital signal comprising:
   a selective predictive filter responsive to an input signal for outputting a predictive residual signal;

a linear predictive analyzer responsive to said predictive residual signal for producing a control signal.

an adaptive predictive filter responsive to said predictive residual signal and to said control signal for outputting an optimal predictive residual signal;

re-quantizing means connected to said adaptive predictive filter for re-quantizing said optimal predictive residual signal and manifesting a transmission output signal.

5. An apparatus for processing a digital signal comprising:

a linear predictive analyzer responsive to an input signal for producing a control signal;

an adaptive predictive filter responsive to said input signal and to said control signal for outputting a predictive residual signal;

a selective predictive filter responsive to said predictive residual signal for outputting an optimal predictive residual signal; and re-quantizing means connected to said selective predictive filter for re-quantizing said optimal predictive residual signal and manifesting a transmission output.

* * * * *